United States Patent
White et al.

(10) Patent No.: US 10,348,094 B2
(45) Date of Patent: Jul. 9, 2019

(54) ENERGY PANEL ARRANGEMENT SHUTDOWN

(71) Applicant: ABB Schweiz AG

(72) Inventors: Paul Michael White, Phoenix, AZ (US); Sagar Arun Khare, Gilbert, AZ (US); Sarah Jean Ozga, Phoenix, AZ (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/547,117

(22) PCT Filed: Jan. 28, 2016

(86) PCT No.: PCT/US2016/015309
§ 371 (c)(1),
(2) Date: Jul. 28, 2017

(87) PCT Pub. No.: WO2016/123305
PCT Pub. Date: Aug. 4, 2016

(65) Prior Publication Data
US 2018/0013292 A1     Jan. 11, 2018

Related U.S. Application Data

(60) Provisional application No. 62/108,758, filed on Jan. 28, 2015.

(51) Int. Cl.
*H02J 3/38* (2006.01)
*H02M 3/04* (2006.01)
(Continued)

(52) U.S. Cl.
CPC ........ *H02J 3/383* (2013.01); *H01L 31/02021* (2013.01); *H01L 31/052* (2013.01);
(Continued)

(58) Field of Classification Search
CPC .......... B60R 25/04; B60R 25/24; B60R 25/10; B60R 25/102; B60R 25/33; G08C 17/02; G08C 19/28; G08C 23/04
(Continued)

(56) References Cited

U.S. PATENT DOCUMENTS 3,387,200 A    6/1968 Godshalk
3,763,398 A   10/1973 Ragaly
(Continued)

FOREIGN PATENT DOCUMENTS

CN          1061288 A     5/1992
CN        201196666 Y     2/2009
(Continued)

OTHER PUBLICATIONS

Rapid System Shutdown (2014 NEC 690.12) Midnite Solar Inc. Renewable Energy System Electrical Components and E-Panels; http://www.midnitesolar.com/rapidshutdown/rapidshutdown.php; Accessed Nov. 2014.
(Continued)

*Primary Examiner* — Mark S Blouin
(74) *Attorney, Agent, or Firm* — Barnes & Thornburg LLP

(57) ABSTRACT

One or more techniques and/or systems are provided for facilitating a shutdown of output power from an energy panel arrangement to an inverter. A shutdown implementation module is coupled between an energy panel arrangement and an inverter that converts DC power from the energy panel arrangement to AC power for an AC power grid. A communication connection is established, over a power-line communication line, between the shutdown implementation module and a shutdown controller associated with the inverter. Responsive to identifying a loss of the communication connection or receiving a shutdown instruc-
(Continued)

tion over the power-line communication line, the shutdown implementation module shuts down output power from the energy panel arrangement to the inverter. The shutdown implementation module may be located within a threshold distance from the energy panel arrangement (e.g., within about 10 feet) so that the output power may be shutoff within a threshold timespan (e.g., within about 10 seconds).

20 Claims, 12 Drawing Sheets

(51) Int. Cl.
  *H02M 7/48* (2007.01)
  *H04B 3/54* (2006.01)
  *H01L 31/02* (2006.01)
  *H02J 13/00* (2006.01)
  *H02S 40/32* (2014.01)
  *H02S 50/00* (2014.01)
  *H02S 50/10* (2014.01)
  *H01L 31/052* (2014.01)

(52) U.S. Cl.
  CPC .......... *H02J 13/0079* (2013.01); *H02M 3/04* (2013.01); *H02M 7/48* (2013.01); *H02S 40/32* (2014.12); *H02S 50/00* (2013.01); *H02S 50/10* (2014.12); *H04B 3/54* (2013.01); *Y02E 10/563* (2013.01)

(58) Field of Classification Search
  USPC ...................................................... 340/12.27
  See application file for complete search history.

(56) References Cited

U.S. PATENT DOCUMENTS

| | | | |
|---|---|---|---|
| 4,358,810 A | 11/1982 | Wafer et al. | |
| 5,229,220 A | 7/1993 | Stanton et al. | |
| 5,338,991 A | 8/1994 | Lu | |
| 6,331,670 B2 | 12/2001 | Takehara et al. | |
| 6,339,538 B1 | 1/2002 | Handleman | |
| 6,657,118 B2 | 12/2003 | Toyomura et al. | |
| 6,727,602 B2 | 4/2004 | Olson | |
| 6,741,435 B1 | 5/2004 | Cleveland | |
| 6,867,704 B2 | 3/2005 | Pellegrino | |
| 7,248,946 B2 | 7/2007 | Bashaw et al. | |
| 7,388,348 B2 | 6/2008 | Mattichak | |
| 7,432,618 B2 | 10/2008 | Taylor | |
| 7,566,828 B2 | 7/2009 | Sasaki | |
| 7,899,035 B2 | 3/2011 | Eklund et al. | |
| 7,924,582 B2 | 4/2011 | Müller et al. | |
| 8,023,266 B2 | 9/2011 | Russell et al. | |
| 8,080,899 B2 | 12/2011 | Paull | |
| 8,106,765 B1 * | 1/2012 | Ackerson ............ H02J 13/0079 340/538 |
| 8,134,812 B2 | 3/2012 | Gilmore et al. | |
| 8,148,849 B2 | 4/2012 | Zanarini et al. | |
| 8,179,147 B2 | 5/2012 | Dargatz et al. | |
| 8,204,709 B2 | 6/2012 | Presher, Jr. et al. | |
| 8,289,183 B1 | 10/2012 | Foss | |
| 8,314,375 B2 | 11/2012 | Arditi et al. | |
| 8,338,989 B2 | 12/2012 | Thompson | |
| 8,362,739 B2 | 1/2013 | Perot et al. | |
| 8,410,950 B2 | 4/2013 | Takehara et al. | |
| 8,454,389 B2 | 6/2013 | Buettner | |
| 8,455,752 B2 | 6/2013 | Korman et al. | |
| 8,466,706 B2 | 6/2013 | Ramsey et al. | |
| 8,482,893 B2 | 7/2013 | West | |
| 8,531,055 B2 | 9/2013 | Adest et al. | |
| 8,547,669 B2 | 10/2013 | Larson et al. | |
| 8,558,102 B2 | 10/2013 | Croft et al. | |
| 8,581,441 B2 | 11/2013 | Rotzoll et al. | |
| 8,587,906 B2 | 11/2013 | Bhavaraju et al. | |
| 8,624,443 B2 | 1/2014 | Mumtaz | |
| 8,645,937 B2 | 2/2014 | Angerer et al. | |
| 8,659,880 B2 | 2/2014 | Russell et al. | |
| 8,659,922 B2 | 2/2014 | Rotzoll | |
| 8,674,545 B2 | 3/2014 | Signorelli et al. | |
| 8,684,758 B2 | 4/2014 | Gharabegian et al. | |
| 8,723,370 B2 | 5/2014 | West | |
| 8,725,437 B2 | 5/2014 | Caine | |
| 8,742,620 B1 | 6/2014 | Brennan et al. | |
| 8,749,934 B2 | 6/2014 | Hackenberg | |
| 8,762,083 B2 | 6/2014 | Rodseth et al. | |
| 8,773,236 B2 | 7/2014 | Makhota et al. | |
| 8,779,632 B2 | 7/2014 | Freyermuth | |
| 8,816,535 B2 | 8/2014 | Adest et al. | |
| 8,829,715 B2 | 9/2014 | Agamy et al. | |
| 8,837,098 B2 | 9/2014 | Victor et al. | |
| 8,842,397 B2 | 9/2014 | Fahrenbruch et al. | |
| 8,847,614 B2 | 9/2014 | DeBone et al. | |
| 8,854,193 B2 | 10/2014 | Makhota et al. | |
| 8,859,884 B2 | 10/2014 | Dunton et al. | |
| 8,860,242 B1 | 10/2014 | Pruett et al. | |
| 2005/0121067 A1 | 6/2005 | Toyomura et al. | |
| 2006/0237058 A1 | 10/2006 | McClintock et al. | |
| 2008/0078436 A1 | 4/2008 | Nachamkin et al. | |
| 2008/0111517 A1 | 5/2008 | Pfeifer et al. | |
| 2008/0174926 A1 | 7/2008 | Evans et al. | |
| 2008/0236648 A1 | 10/2008 | Klein et al. | |
| 2008/0285317 A1 | 11/2008 | Rotzoll | |
| 2009/0000654 A1 | 1/2009 | Rotzoll et al. | |
| 2009/0140715 A1 | 6/2009 | Adest et al. | |
| 2009/0141522 A1 | 6/2009 | Adest et al. | |
| 2009/0207543 A1 | 8/2009 | Boniface et al. | |
| 2010/0019913 A1 | 1/2010 | Rodseth et al. | |
| 2010/0127570 A1 | 5/2010 | Hadar et al. | |
| 2010/0139734 A1 * | 6/2010 | Hadar ............... H01L 31/02021 136/244 |
| 2010/0139743 A1 | 6/2010 | Hadar et al. | |
| 2010/0275966 A1 | 11/2010 | Felts et al. | |
| 2010/0321837 A1 | 12/2010 | Caiti et al. | |
| 2011/0044083 A1 | 2/2011 | Thompson | |
| 2011/0049990 A1 | 3/2011 | Amaratunga et al. | |
| 2011/0088741 A1 | 4/2011 | Dunton et al. | |
| 2011/0088743 A1 | 4/2011 | Luo et al. | |
| 2011/0121652 A1 | 5/2011 | Sella et al. | |
| 2011/0138377 A1 | 6/2011 | Allen | |
| 2011/0149618 A1 | 6/2011 | Babcock et al. | |
| 2011/0157753 A1 | 6/2011 | Gilmore et al. | |
| 2011/0172842 A1 | 7/2011 | Makhota et al. | |
| 2011/0218687 A1 | 9/2011 | Hardar et al. | |
| 2011/0222327 A1 | 9/2011 | Thompson | |
| 2011/0245989 A1 | 10/2011 | Makhota et al. | |
| 2011/0255316 A1 | 10/2011 | Burger et al. | |
| 2011/0266376 A1 | 11/2011 | Lauinger et al. | |
| 2011/0273302 A1 * | 11/2011 | Fornage ............... G01R 31/026 340/635 |
| 2011/0276188 A1 | 11/2011 | Beck | |
| 2011/0292705 A1 | 12/2011 | Fornage | |
| 2011/0298292 A1 | 12/2011 | Bremicker et al. | |
| 2012/0026769 A1 | 2/2012 | Schroeder et al. | |
| 2012/0038227 A1 | 2/2012 | West | |
| 2012/0039101 A1 | 2/2012 | Falk et al. | |
| 2012/0048328 A1 | 3/2012 | Solon | |
| 2012/0049879 A1 | 3/2012 | Crites | |
| 2012/0053867 A1 | 3/2012 | Dunn et al. | |
| 2012/0081937 A1 | 4/2012 | Phadke | |
| 2012/0091810 A1 | 4/2012 | Aiello et al. | |
| 2012/0126626 A1 | 5/2012 | Falk et al. | |
| 2012/0140380 A1 | 6/2012 | Lin | |
| 2012/0140534 A1 | 6/2012 | Inukai et al. | |
| 2012/0151240 A1 | 6/2012 | Robinson et al. | |
| 2012/0161527 A1 * | 6/2012 | Casey ............... H01L 31/02021 307/80 |
| 2012/0175961 A1 | 7/2012 | Har-Shai et al. | |
| 2012/0205974 A1 | 8/2012 | McCaslin et al. | |
| 2012/0235498 A1 | 9/2012 | Johnson et al. | |
| 2012/0242320 A1 | 9/2012 | Fischer et al. | |
| 2012/0256584 A1 | 10/2012 | Crites | |
| 2012/0281444 A1 | 11/2012 | Dent | |
| 2012/0285502 A1 | 11/2012 | Philipp | |

(56) References Cited

U.S. PATENT DOCUMENTS

| | | | |
|---|---|---|---|
| 2012/0310427 | A1 | 12/2012 | Williams et al. |
| 2012/0314747 | A1 | 12/2012 | Boivin et al. |
| 2012/0319489 | A1 | 12/2012 | McCaslin et al. |
| 2012/0325283 | A1 | 12/2012 | Robbins |
| 2013/0009483 | A1 | 1/2013 | Kawati et al. |
| 2013/0015875 | A1 | 1/2013 | Kumar |
| 2013/0026839 | A1 | 1/2013 | Grana |
| 2013/0033115 | A1 | 2/2013 | Cutler et al. |
| 2013/0050906 | A1 | 2/2013 | Peplinski et al. |
| 2013/0068284 | A1 | 3/2013 | Beardsworth et al. |
| 2013/0106196 | A1 | 5/2013 | Johnson et al. |
| 2013/0139384 | A1 | 6/2013 | Abroy |
| 2013/0148394 | A1 | 6/2013 | O'Brien et al. |
| 2013/0194706 | A1 | 8/2013 | Har-Shai et al. |
| 2013/0207678 | A1 | 8/2013 | DeBone et al. |
| 2013/0215983 | A1 | 8/2013 | Fornage |
| 2013/0250641 | A1 | 9/2013 | Falk |
| 2013/0263910 | A1 | 10/2013 | Shinohara |
| 2013/0307556 | A1 | 11/2013 | Ledenev et al. |
| 2014/0003108 | A1 | 1/2014 | Song et al. |
| 2014/0055900 | A1 | 2/2014 | Luebke et al. |
| 2014/0056044 | A1 | 2/2014 | Yang et al. |
| 2014/0060616 | A1 | 3/2014 | Okandan et al. |
| 2014/0062198 | A1 | 3/2014 | Luo |
| 2014/0070815 | A1 | 3/2014 | Liu et al. |
| 2014/0078791 | A1 | 3/2014 | Gurudasani et al. |
| 2014/0103855 | A1 | 4/2014 | Wolter |
| 2014/0112041 | A1* | 4/2014 | Collin .................... H02J 3/383 363/123 |
| 2014/0142874 | A1 | 5/2014 | Martin et al. |
| 2014/0153303 | A1 | 6/2014 | Potharaju |
| 2014/0167513 | A1 | 6/2014 | Chang et al. |
| 2014/0183950 | A1 | 7/2014 | Kohler |
| 2014/0185344 | A1 | 7/2014 | Fornage et al. |
| 2014/0210275 | A1 | 7/2014 | Gong et al. |
| 2014/0233286 | A1 | 8/2014 | Adest et al. |
| 2014/0265603 | A1* | 9/2014 | Augustoni .............. H02S 50/00 307/80 |
| 2014/0285024 | A1 | 9/2014 | Cheng et al. |
| 2014/0291721 | A1 | 10/2014 | Robbins |
| 2014/0292085 | A1 | 10/2014 | Yoscovich et al. |
| 2014/0313640 | A1 | 10/2014 | Peplinski et al. |
| 2014/0355322 | A1 | 12/2014 | Perreault et al. |
| 2014/0360561 | A1 | 12/2014 | Meyer et al. |
| 2014/0373894 | A1 | 12/2014 | Stratakos et al. |
| 2014/0375145 | A1 | 12/2014 | Volz |
| 2014/0376289 | A1 | 12/2014 | Bixel et al. |
| 2015/0270785 | A1 | 9/2015 | Idt et al. |
| 2016/0197575 | A1 | 7/2016 | Armstrong et al. |

FOREIGN PATENT DOCUMENTS

| | | |
|---|---|---|
| CN | 201820311 U | 5/2011 |
| CN | 102109578 A | 6/2011 |
| CN | 102157966 A | 8/2011 |
| CN | 102193049 A | 9/2011 |
| CN | 202004452 U | 10/2011 |
| CN | 202119876 U | 1/2012 |
| CN | 202309503 U | 7/2012 |
| CN | 202474830 U | 10/2012 |
| CN | 202524069 U | 11/2012 |
| CN | 202535258 U | 11/2012 |
| CN | 202586793 U | 12/2012 |
| CN | 102867871 A | 1/2013 |
| CN | 202798128 U | 3/2013 |
| CN | 202839677 U | 3/2013 |
| CN | 202870216 U | 4/2013 |
| CN | 202872351 U | 4/2013 |
| CN | 103166240 A | 6/2013 |
| CN | 202997559 U | 6/2013 |
| CN | 103197613 A | 7/2013 |
| CN | 103208793 A | 7/2013 |
| CN | 203119597 U | 8/2013 |
| CN | 203119796 U | 8/2013 |
| CN | 203289188 U | 11/2013 |
| CN | 203350386 U | 12/2013 |
| CN | 203377671 U | 1/2014 |
| CN | 203378087 U | 1/2014 |
| CN | 103606956 A | 2/2014 |
| CN | 103747567 A | 4/2014 |
| CN | 203617965 U | 5/2014 |
| CN | 203618465 U | 6/2014 |
| CN | 203689677 U | 7/2014 |
| DE | 10027879 A1 | 12/2001 |
| DE | 202007001648 U1 | 9/2007 |
| DE | 102010017746 A1 | 11/2011 |
| DE | 102010049293 B3 | 2/2012 |
| DE | 102011006949 A1 | 10/2012 |
| DE | 102011018972 A | 10/2012 |
| DE | 102012019556 A1 | 2/2014 |
| DE | 102011053524 B4 | 5/2015 |
| EP | 2048679 B1 | 4/2010 |
| EP | 2355367 A1 | 8/2011 |
| EP | 2442419 A2 | 4/2012 |
| EP | 2503669 A2 | 9/2012 |
| EP | 2621045 A2 | 7/2013 |
| EP | 2725678 A1 | 4/2014 |
| JP | 2012205078 A | 10/2012 |
| JP | 2012000100301 | 11/2013 |
| WO | 2005031959 A1 | 4/2005 |
| WO | 2008138619 A1 | 11/2008 |
| WO | 2009045173 A2 | 4/2009 |
| WO | 2009051870 A1 | 4/2009 |
| WO | 2010042533 A2 | 4/2010 |
| WO | 2011077134 A2 | 6/2011 |
| WO | 2012035384 A1 | 3/2012 |
| WO | 2012079729 A2 | 6/2012 |
| WO | 2012176222 A1 | 12/2012 |
| WO | 2014011593 A1 | 1/2014 |

OTHER PUBLICATIONS

Understanding the NEC 2014 and Its Impact on PV Systems: p. 1 of 23; Rebekah Hern et al., http://solarprofessional.com/articles/design-installation/understanding-the-nec-2014-and-its-impact-on-pv-systems?v=disable_pagination&nopaging=1#.WgnW5BvruHs; Apr. 2014; Accessed Nov. 2014.

Corresponding International Application, PCT/US2016/015309, International Search report dated May 3, 2016.

Office Action from related Chinese Patent Appl. No. 201680007616.9, dated Sep. 25, 2018, 14 pages (including English translation).

Office Action from related European Patent Appl. No. 16705620.9, dated Dec. 5, 2018, 6 pages.

Office Action from related Chinese Patent Appl. No. 201680007616.9, dated Apr. 28, 2019, 20 pages (including English translation).

\* cited by examiner

ENERGY PANEL ARRANGEMENT SHUTDOWN

CROSS-REFERENCE TO RELATED APPLICATIONS

This application is a U.S. national stage of International Application Serial No. PCT/US2016/015309, filed Jan. 28, 2016, which claims priority to and the benefit of U.S. Provisional Patent Application No. 62/108,758, titled "ENERGY PANEL ARRANGEMENT SHUTDOWN" and filed Jan. 28, 2015, which is incorporated herein by reference.

BACKGROUND

Many buildings may utilize energy panel arrangements, such as photovoltaic systems comprising solar panels that absorb and convert sunlight into electricity, for power generation. An inverter may be configured to convert DC power from an energy panel arrangement to AC power for an AC power grid that may supply power to a building. The energy panel arrangement may be installed outside of the building, such as on a roof of the building. A DC power line may couple the energy panel arrangement to the inverter. The inverter may be installed in a different location of the building than the energy panel arrangement, such as in a basement of the building where electrical service enters the building into an electrical panel. The energy panel arrangement may provide DC power over the DC power line to the inverter. In the event an issue arises, such as a fire in the building, an arc flash, a need to shut down power to the building, etc., the DC power line may need to be shut down and de-energized. For example, electrical standards may specify that conductors of a photovoltaic system are to discharge to a reduced output power within about 10 seconds at a distance of about 10 feet or less from the solar panels. Unfortunately, the inverter may be installed further than 10 feet from the solar panels.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

Among other things, one or more systems and/or techniques for facilitating a shutdown of output power from an energy panel arrangement to an inverter are provided herein. A shutdown implementation module is coupled between an energy panel arrangement (e.g., a photovoltaic system comprising solar panels) and an inverter that is configured to convert DC power from the energy panel arrangement to AC power for an AC power grid. The shutdown implementation module is configured to establish a communication connection, over a power-line communication line between the energy panel arrangement and the inverter (e.g., a DC power line over which DC power is supplied from the energy panel arrangement to the inverter), with a shutdown controller associated with the inverter. Responsive to identifying a loss of the communication connection (e.g., a DC disconnect of the inverter may be opened, a loss of a heartbeat signal provided by the shutdown controller over the power-line communication line, etc.), the shutdown implementation module may shutdown output power from the energy panel arrangement to the inverter. Responsive to receiving an instruction (e.g., a shutdown instruction, an arc-fault notification instruction, etc.) over the power-line communication line from the shutdown controller, the shutdown implementation module may shutdown output power from the energy panel arrangement to the inverter. In this way, the shutdown implementation module may shutdown output power provided by the energy panel arrangement to the inverter, such as over the power-line communication line (e.g., the DC power line), within a threshold timespan at a threshold distance from the energy panel arrangement (e.g., shutdown to a reduced output power according to an electrical specification such as within about 10 seconds at a distance of about 10 feet or less).

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
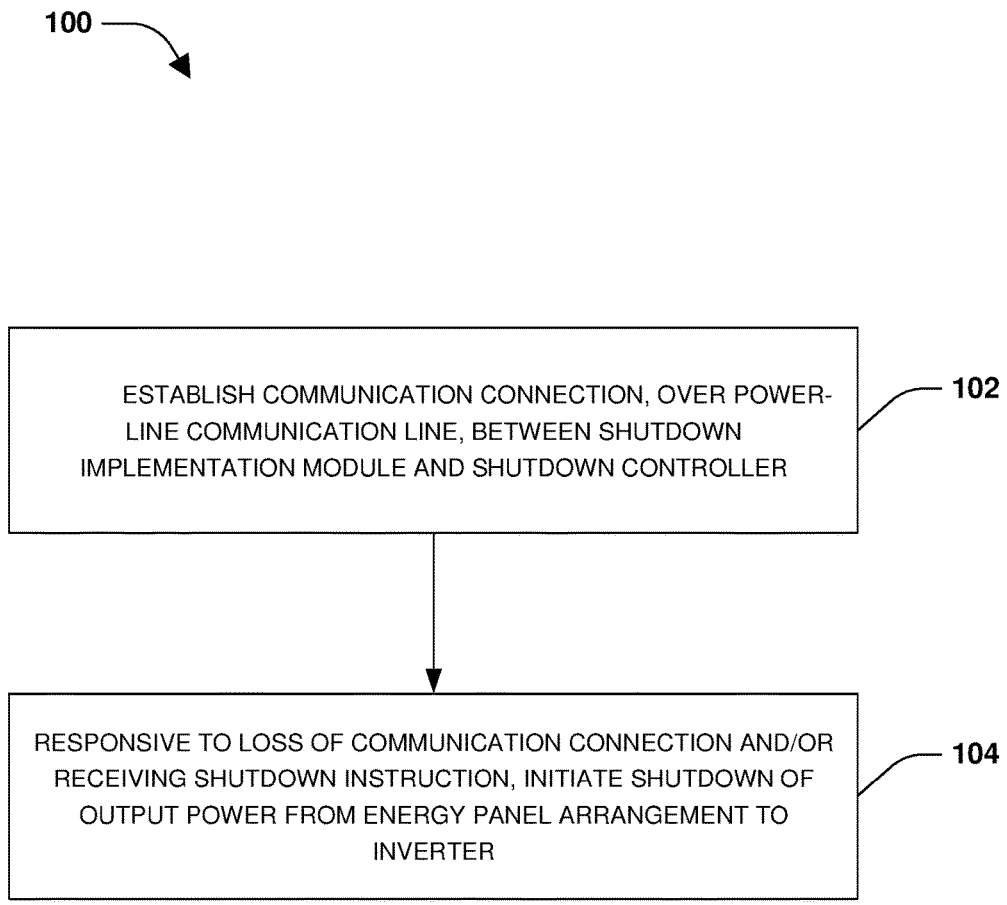
FIG. 1 is a flow diagram illustrating an exemplary method of facilitating a shutdown of output power from an energy panel arrangement to an inverter.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

An embodiment of facilitating a shutdown of output power from an energy panel arrangement to an inverter is illustrated by an exemplary method 100 of FIG. 1. At 102, a communication connection may be established over a power-line communication line between an energy panel arrangement (e.g., a photovoltaic system comprising solar panels configured to convert sunlight into DC power) and an inverter (e.g., an inverter configured to convert DC power from the energy panel arrangement to AC power for an AC power grid). The communication connection may be established between a shutdown implementation module and a shutdown controller. The shutdown implementation module may be coupled between the energy panel arrangement and the inverter (e.g., the shutdown implementation module may be located within a threshold distance, such as about 10 feet or less, from the energy panel arrangement, which may satisfy an electrical specification for photovoltaic systems even though the solar panels may be located further away from the inverter, such as where the solar panels are on a roof of a building and the inverter is inside the building such as in the basement). In an example, the energy panel arrangement may supply the DC power to the inverter over the power-line communication line.

At 104, responsive to identifying a loss of the communication connection and/or receiving a shutdown instruction over the power-line communication line from the shutdown controller, a shutdown of output power (e.g., to a reduced output power below a threshold and/or within a threshold timespan specified by the electrical specification, such as within about 10 seconds) from the energy panel arrangement to the inverter may be initiated. The loss of the communication connection may correspond to an opening of a DC disconnect of the inverter that closes the communication connection over the power-line communication line, a loss of a heartbeat signal received over the power-line communication line from the shutdown controller, etc. The shutdown instruction may correspond to an instruction sent by the shutdown controller over the power-line communication line to the shutdown implementation module (e.g., an instruction that is based upon the shutdown controller receiving a shutoff status input signal such as from a user invoking a shutoff button, lever, or other mechanism associated with an inverter box housing the inverter; an instruction that is based upon the shutdown controller detecting an arc fault associated with the inverter box; etc.). The shutdown implementation module may comprise a shutdown discharge circuit configured to discharge the output power from the energy panel arrangement (e.g., a mechanical switch and/or a semiconductor arrangement configured to direct current from capacitors of the photovoltaic system through a resistor or other discharge mechanism for discharge of the output power).

In an example, the shutdown implementation module may perform a self-evaluation utilizing a temperature sensor, an electrical parameter measurement sensor (e.g., a current sensor), and/or other types of sensors. Responsive to the self-evaluation resulting in an operational alert for the shutdown implementation module (e.g., an increase in temperature above a safe operational temperature threshold), the shutdown implementation module may shutdown the output power from the energy panel arrangement to the inverter. Responsive to identifying a resolution of an operational issue specified by the operational alert (e.g., the shutdown implementation module may cool down to a temperature within the safe operational temperature threshold), the shutdown implementation module may initiate startup of output power from the energy panel arrangement to the inverter.

In an example, the shutdown implementation module may evaluate the inverter (e.g., the shutdown implementation module may execute diagnostic functionality on the inverter and/or the shutdown controller; the shutdown implementation module may receive diagnostic information from the shutdown controller; etc.). Responsive to detecting an inverter failure of the inverter, the shutdown implementation module may implement a short-circuit condition removal procedure, such as shutting down or adjusting the output power from the energy panel arrangement to the inverter.

In an example, the shutdown implementation module may receive a software update over the power-line communication line. The software update may comprise an instruction for the software update (e.g., a firmware update, an update to software, etc.) to be applied to the shutdown implementation module. The shutdown implementation module may implement the software update to update the shutdown implementation module.

FIGS. 2A-2I illustrate examples of a system 200 for facilitating a shutdown of output power from an energy panel arrangement 202 to an inverter 208. In an example, the system 200 may comprise a shutdown implementation module 204. In another example, the system 200 may comprise a shutdown controller 210. In another example, the system 200 may comprise the shutdown implementation module 204 and the shutdown controller 210.

Figure 2A:
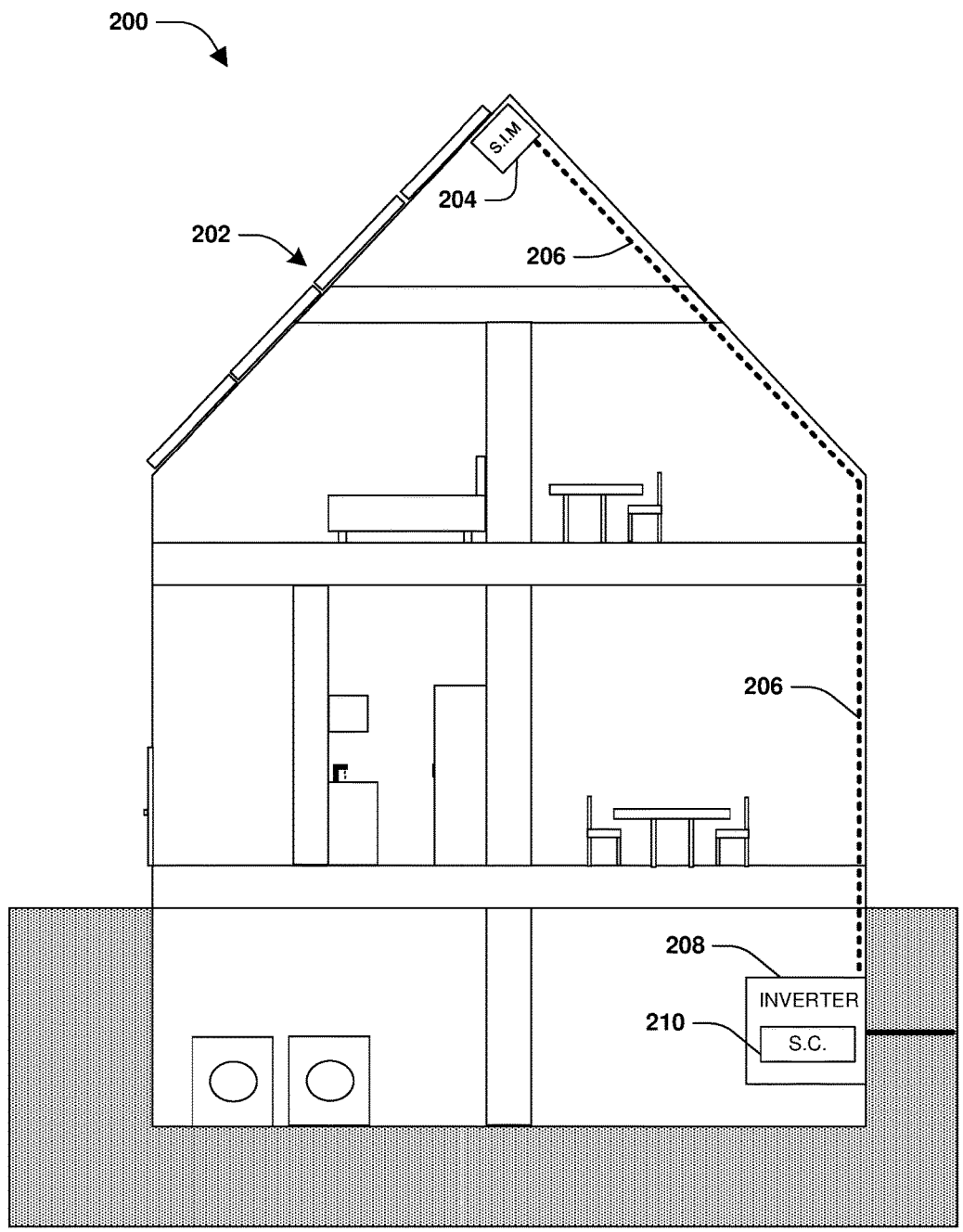
FIG. 2A is a component block diagram illustrating an exemplary system for facilitating a shutdown of output power from an energy panel arrangement to an inverter.

FIG. 2A illustrates the shutdown implementation module 204 coupled between the energy panel arrangement 202 (e.g., a photovoltaic system mounted on a roof of a building) and the inverter 208 (e.g., an inverter box located within a basement of the building, such as where an electrical panel connects to electrical power entering the building). The inverter 208 may be configured to convert DC power from the energy panel arrangement 202 to AC power for an AC power grid 240 illustrated in FIG. 2B. The DC power may be received over a DC power line connected between the energy panel arrangement 202 and the inverter 208, such as a power-line communication line 206.

Figure 2B:
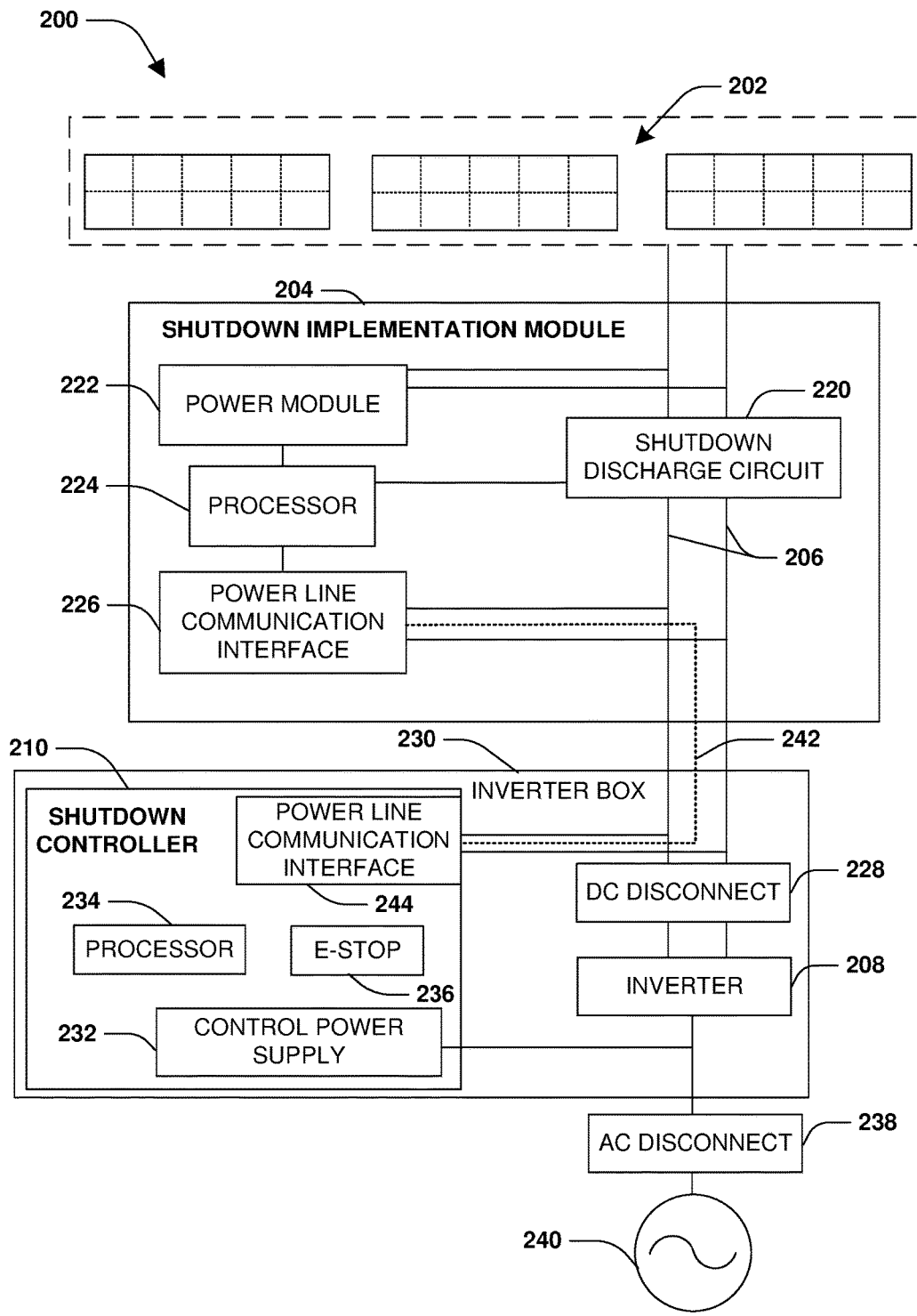
FIG. 2B is a component block diagram illustrating an exemplary system for facilitating a shutdown of output power from an energy panel arrangement to an inverter.

FIG. 2B illustrates the shutdown implementation module 204 comprising a power module 222, a processor 224, a power line communication interface 226, and/or a shutdown discharge circuit 220. The power module 222 may be configured to provide power to the shutdown implementation module 204 based upon power provided by the energy panel arrangement 202. The shutdown implementation module 204 may be coupled to the power-line communication line 206 between the energy panel arrangement 202 and the inverter 208 located within an inverter box 230. The processor 224 may be configured to control the shutdown implementation module 204, such as to control the shutdown discharge circuit 220, implement instructions from the shutdown controller 210 (e.g., an instruction to shutdown output power from the energy panel arrangement 202 to the inverter 208), evaluate the inverter 208 for faults, perform self-evaluations, update software such as firmware, etc. The shutdown discharge circuit 220 may be invoked to discharge current (e.g., current from capacitors of the photovoltaic system) associated with shutting down the output power (e.g., a mechanical switch and/or a semiconductor arrangement may direct current through a resistor or other discharge mechanism for discharge of the output power). The shutdown implementation module 204 may be located a threshold distance from the energy panel arrangement 202, such as within about 10 feet or less, and may be capable of reducing the output power to a reduced output power within a threshold timespan (e.g., within about 10 seconds or less) using the shutdown discharge circuit 220.

The power line communication interface 226 may establish a communication connection 242 over the power-line communication line 206. The power line communication interface 226 may facilitate communication between the shutdown implementation module 204 (e.g., the processor 224 of the shutdown implementation module 204) and the shutdown controller 210 (e.g., a processor 234 of the shutdown controller 210). In an example where the power-line communication line 206 comprises a DC power line over which DC power is supplied from the energy panel arrangement 202 to the inverter 208, communication signals may be sent over the DC power line by modulating higher frequency signals as the communication signals.

The shutdown controller 210 may comprise the processor 234, a power line communication interface 244, an emergency stop 236, and/or a control power supply 232. The power line communication interface 244 may establish the communication connection 242 over the power-line communication line 206 with the power line communication interface 226 of the shutdown implementation module 204. The processor 234 may be configured to send instructions and/or information over the power-line communication line 206 (e.g., using the communication connection 242) to the shutdown implementation module 204 (e.g., a shutdown instruction, an arc-flash notification instruction, a software update, a heartbeat signal indicating that output power should be provided to the inverter 208 by the energy panel arrangement 202, etc.). The control power supply 232 may power the shutdown controller 210 based upon AC power provided by the inverter 208. The shutdown controller 210 may be configured to identify a power shutdown condition based upon various triggers, such as a user invoking the emergency stop 236, the user utilizing the DC disconnect 228 to disconnect the power-line communication line 206 from the inverter 208, utilizing an AC disconnect 238 to disconnect power from the AC power grid 240 (e.g., resulting in a power loss of the shutdown controller 210 such that the shutdown controller 210 does not provide the heartbeat signal to the shutdown implementation module 204, which may trigger the shutdown implementation module 204 to shut down the output power from the energy panel arrangement 202 to the inverter 208), etc.

Figure 2C:
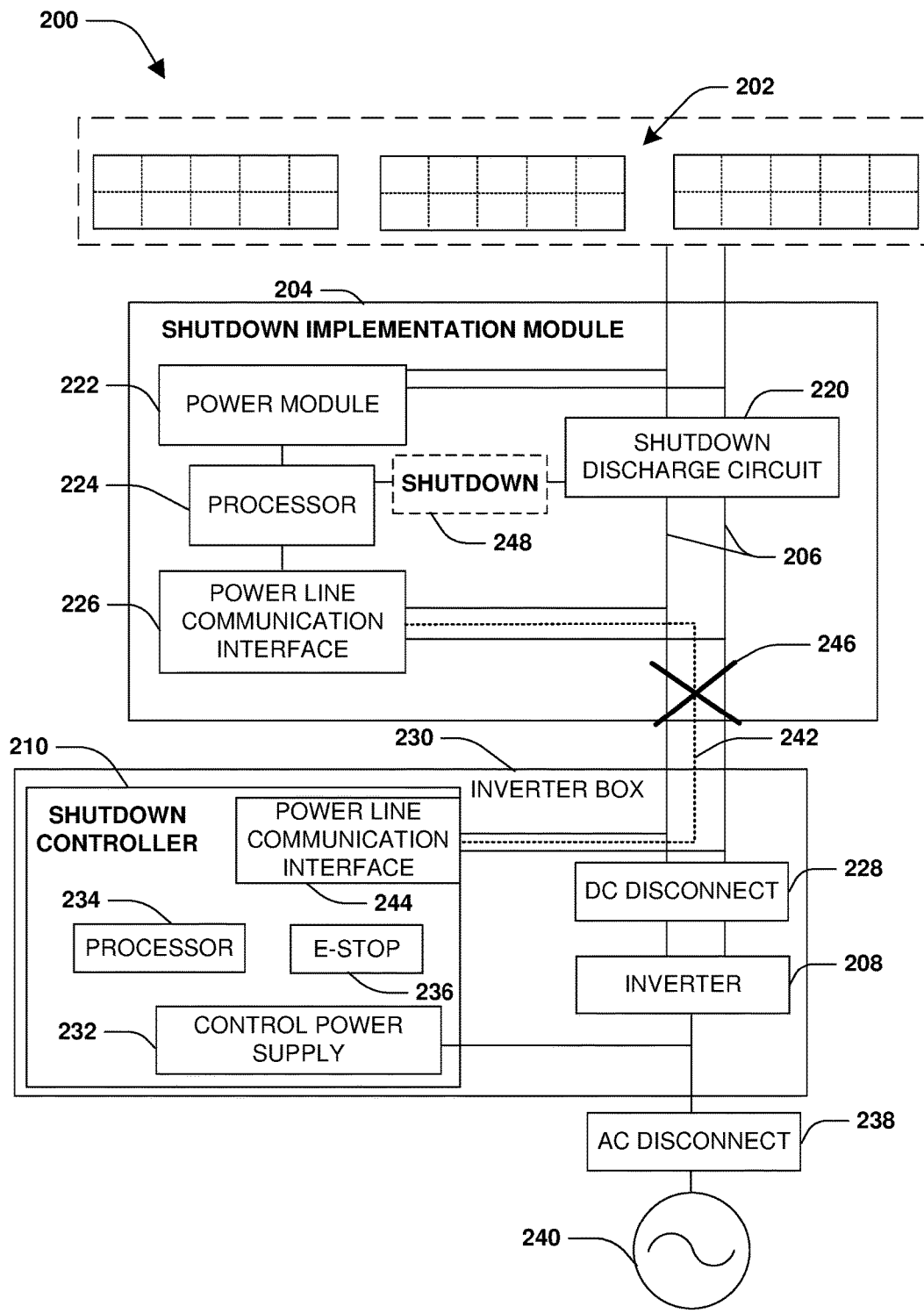
FIG. 2C is a component block diagram illustrating an exemplary system for facilitating a shutdown of output power from an energy panel arrangement to an inverter based upon a loss of a communication connection.

FIG. 2C illustrates an example of the shutdown implementation module 204 initiating a shutdown 248 of output power from the energy panel arrangement 202 to the inverter 208 based upon a loss 246 of the communication connection 242 over the power-line communication line 206. In an example, the power line communication interface 226 of the shutdown implementation module 204 may receive a heartbeat signal over the power-line communication line 206, such as over the communication connection 242, from the shutdown controller 210. The processor 224 may be configured to maintain the output power from the energy panel arrangement 202 to the inverter 208 so long as the heartbeat signal is received. The loss 246 of the communication connection 242 may be detected based upon a loss of the heartbeat signal. In another example, the communication loss 246 may occur based upon an opening of the DC disconnect 228 associated with the inverter 208. Accordingly, the processor 224 of the shutdown implementation module 204 may initiate shutdown 248 of output power from the energy panel arrangement 202 to the inverter 208 using the shutdown discharge circuit 220 (e.g., mechanical switches and/or semiconductor arrangements of the shutdown discharge circuit 220 may be used to direct current through a resistor to discharge output power).

Figure 2D:
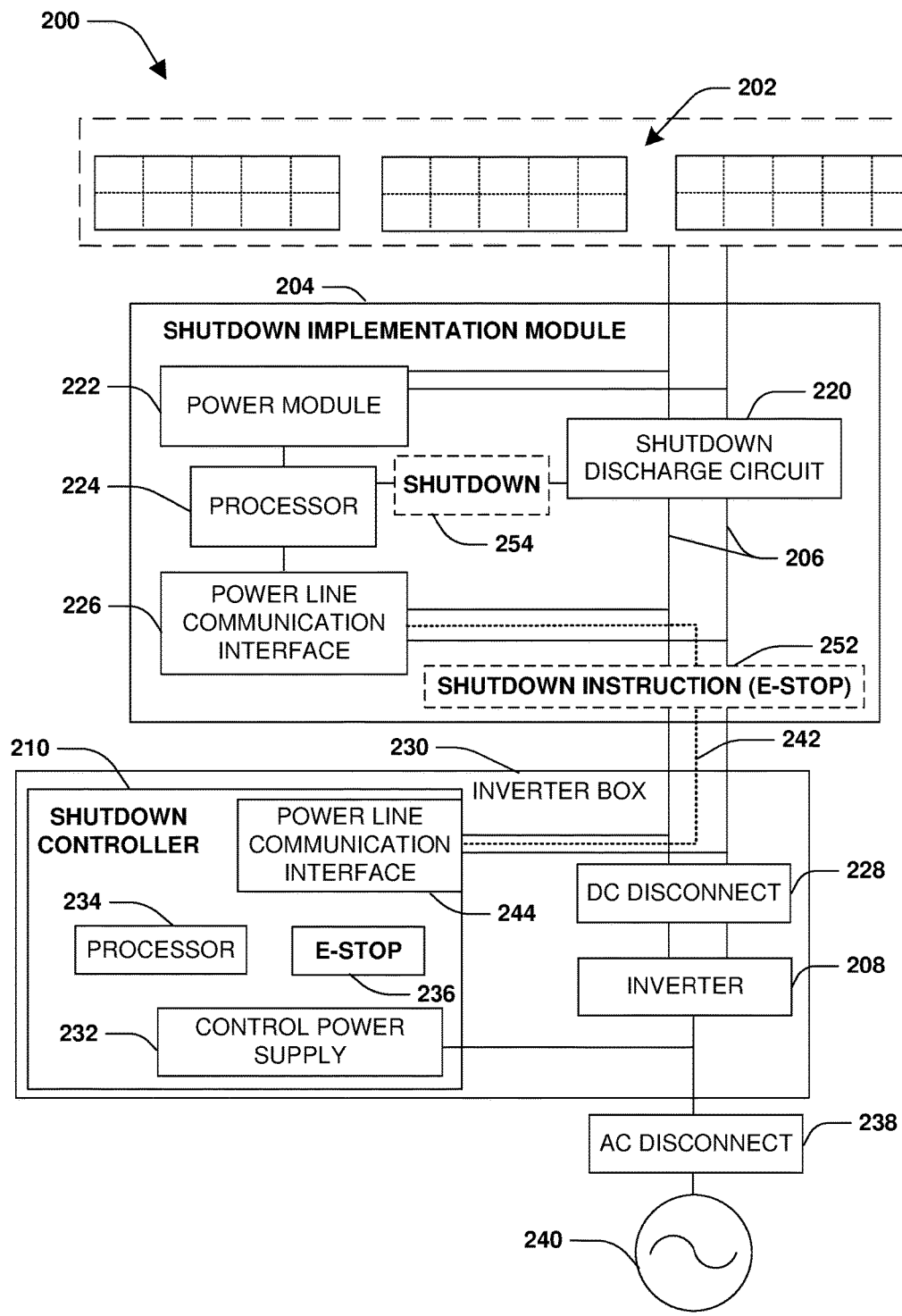
FIG. 2D is a component block diagram illustrating an exemplary system for facilitating a shutdown of output power from an energy panel arrangement to an inverter based upon a shutdown instruction.

FIG. 2D illustrates an example of the shutdown implementation module 204 initiating a shutdown 254 of output power from the energy panel arrangement 202 to the inverter 208 based upon receipt of a shutdown instruction 252. In an example, a user may invoke the emergency stop 236 of the shutdown controller 210 (e.g., push a button, pull a lever, etc.). The processor 234 of the shutdown controller 210 may utilize the power line communication interface 244 to send the shutdown instruction 252 through the power-line communication line 206, such as over the communication connection 242, to the shutdown implementation module 204 based upon the invocation of the emergency stop 236. Accordingly, the processor 224 of the shutdown implementation module 204 may initiate shutdown 254 of output power from the energy panel arrangement 202 to the inverter 208 using the shutdown discharge circuit 220.

Figure 2E:
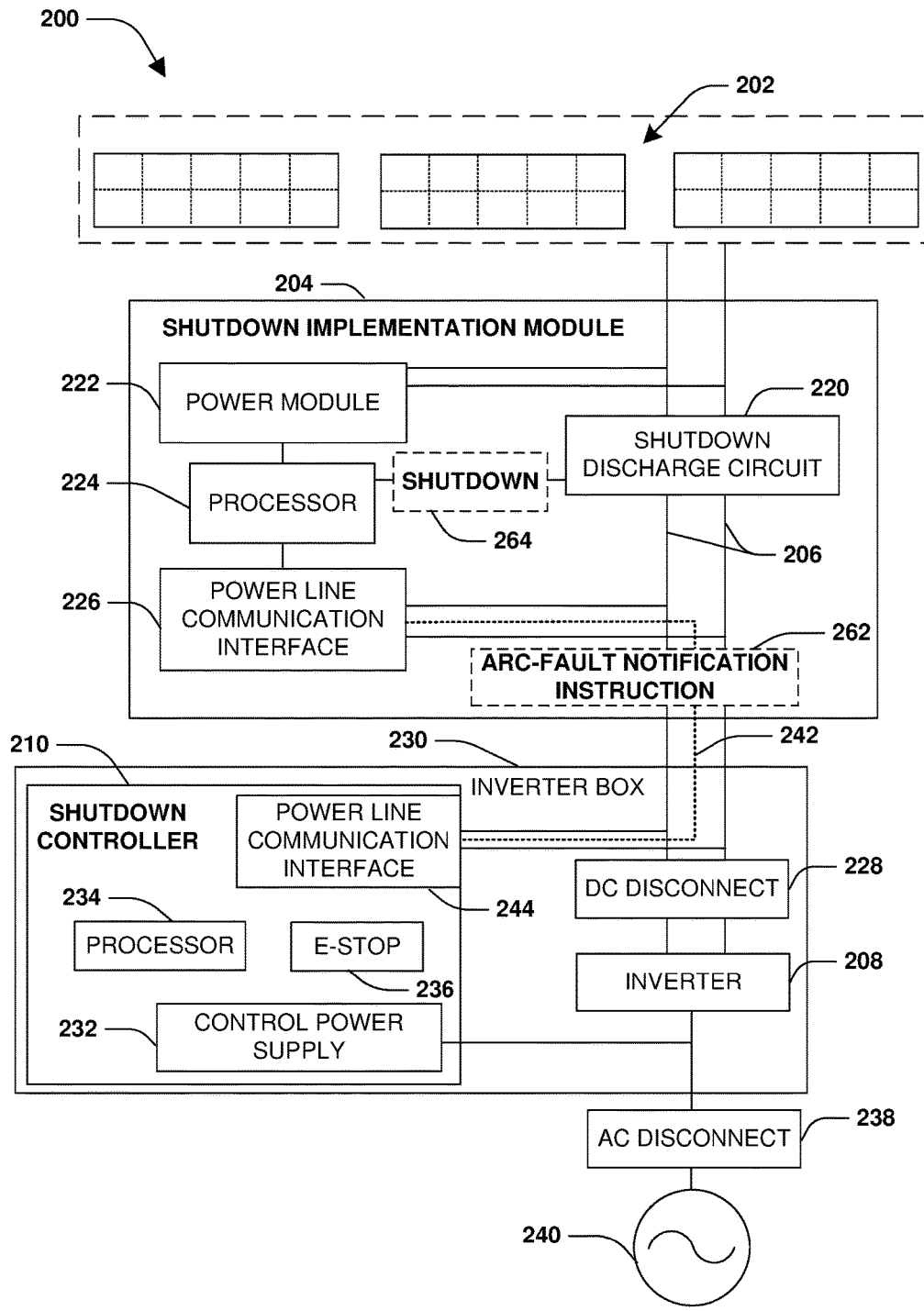
FIG. 2E is a component block diagram illustrating an exemplary system for facilitating a shutdown of output power from an energy panel arrangement to an inverter based upon an arc-fault notification instruction.

FIG. 2E illustrates an example of the shutdown implementation module 204 initiating a shutdown 264 of output power from the energy panel arrangement 202 to the inverter 208 based upon receipt of an arc-fault notification instruction 262. In an example, the processor 234 of the shutdown controller 210 may identify an arc-fault associated with the inverter box 230 or other component associated with providing AC power over the AC power grid 240. The processor 234 of the shutdown controller 210 may utilize the power line communication interface 244 to send the arc-fault notification instruction 262 through the power-line communication line 206, such as over the communication connection 242, to the shutdown implementation module 204 based upon the arc-fault. Accordingly, the processor 224 of the shutdown implementation module 204 may initiate shutdown 264 of output power from the energy panel arrangement 202 to the inverter 208 using the shutdown discharge circuit 220.

Figure 2F:
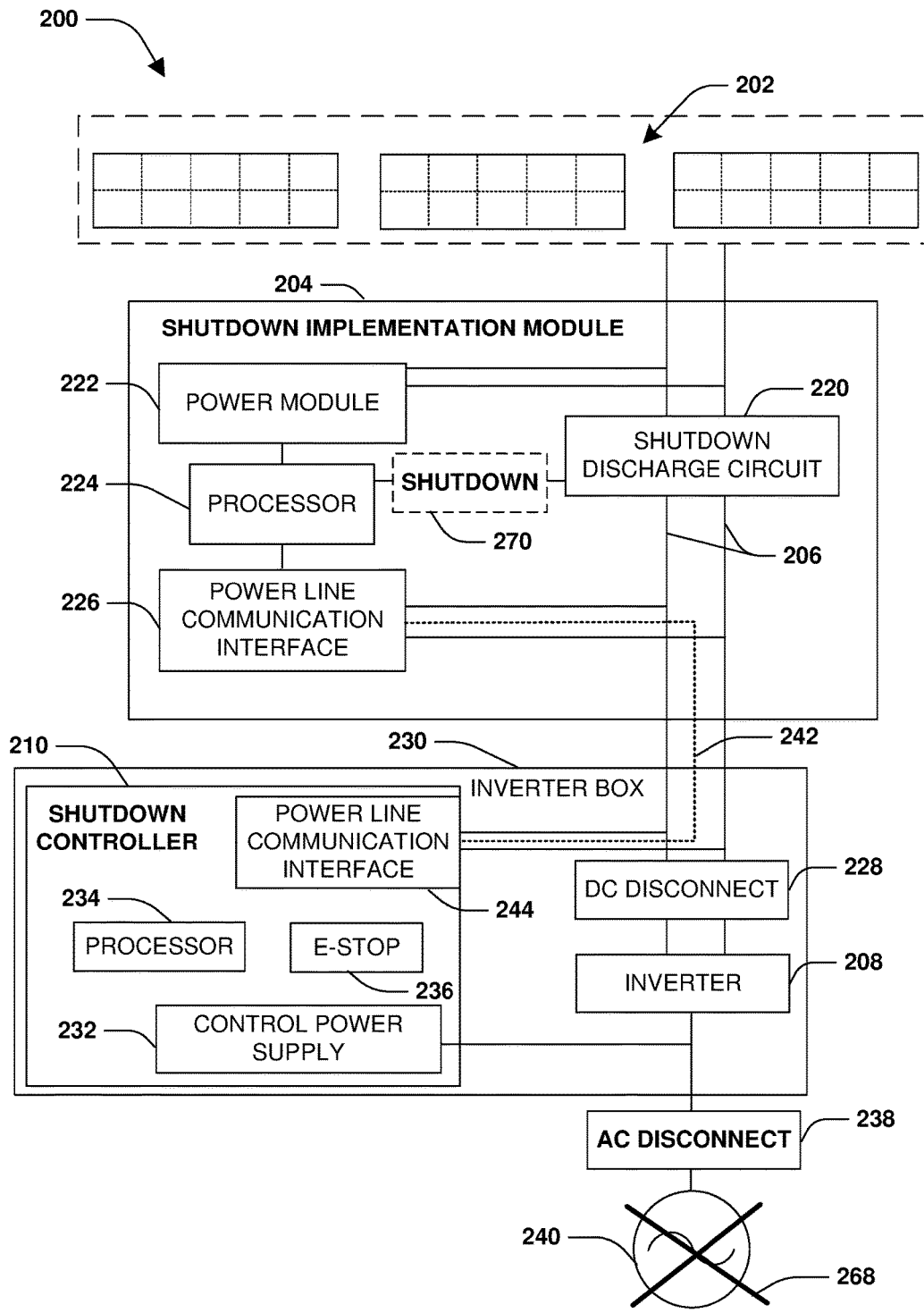
FIG. 2F is a component block diagram illustrating an exemplary system for facilitating a shutdown of output power from an energy panel arrangement to an inverter based upon a power loss of an AC power grid.

FIG. 2F illustrates an example of the shutdown implementation module 204 initiating a shutdown 270 of output power from the energy panel arrangement 202 to the inverter 208 based upon a power loss 268 of the AC power grid 240. For example, the shutdown implementation module 204 may identify the power loss 268 of the AC power grid 240 based upon an opening of an AC disconnect 238 between the inverter 208 and the AC power grid 240. Accordingly, the processor 224 of the shutdown implementation module 204 may initiate shutdown 270 of output power from the energy panel arrangement 202 to the inverter 208 using the shutdown discharge circuit 220.

Figure 2G:
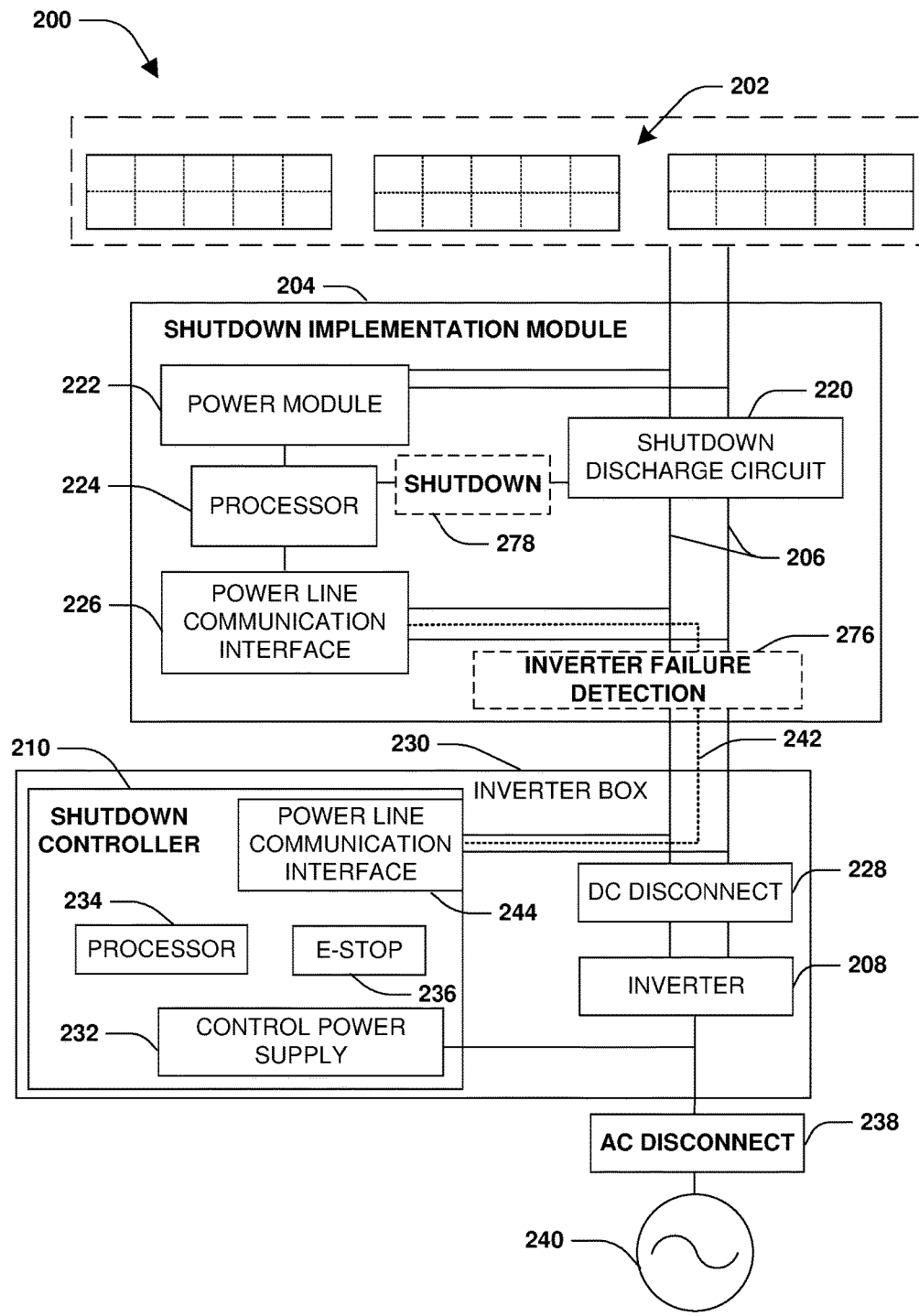
FIG. 2G is a component block diagram illustrating an exemplary system for facilitating a shutdown of output power from an energy panel arrangement to an inverter based upon detection of an inverter failure.

FIG. 2G illustrates an example of the shutdown implementation module 204 initiating a shutdown 278 of output power from the energy panel arrangement 202 to the inverter 208 based upon a detection 276 of an inverter failure 276 of the inverter 208. For example, the shutdown implementation module 204 may evaluate operational health statistics of the inverter 208 that are obtained through the power-line communication line 206, such as over the communication connection 242 (e.g., the shutdown implementation module 204 may measure and/or collect operational health statistics and/or the shutdown controller 210 may provide operational health statistics over the communication connection 242 to the shutdown implementation module 204). Responsive to the operational health statistics indicating an inverter failure or degraded performance, the processor 224 of the shutdown implementation module 204 may initiate shutdown 278 of output power from the energy panel arrangement 202 to the inverter 208 using the shutdown discharge circuit 220.

Figure 2H:
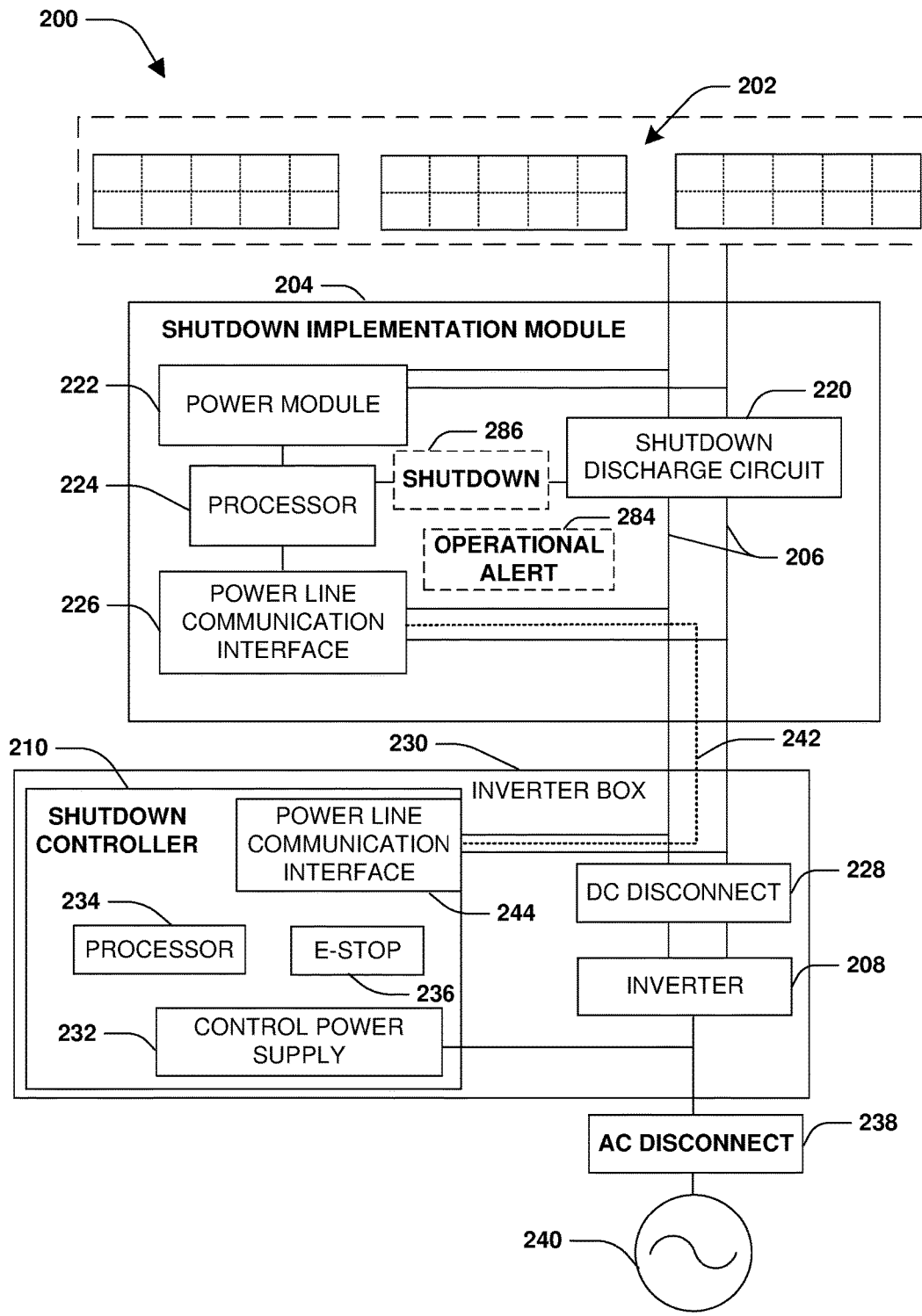
FIG. 2H is a component block diagram illustrating an exemplary system for facilitating a shutdown of output power from an energy panel arrangement to an inverter based upon an operational alert.

FIG. 2H illustrates an example of the shutdown implementation module 204 initiating a shutdown 286 of output power from the energy panel arrangement 202 to the inverter 208 based upon an operational alert 284 for the shutdown implementation module 204. For example, the shutdown implementation module 204 may perform a self-evaluation utilizing a temperature sensor, an electrical parameter measurement sensor (e.g., a current sensor), and/or various other sensors used to determine whether the shutdown implementation module 204 is operating within spec or out of spec (e.g., a failure, degraded performance, etc.). Responsive to the self-evaluation resulting in the operational alert 284 (e.g., an unsafe operating temperature) for the shutdown implementation module 204, the shutdown implementation module 204 may initiate shutdown 286 of output power from the energy panel arrangement 202 to the inverter 208 using the shutdown discharge circuit 220. Responsive to identifying a resolution of an operational issue (e.g., the shutdown implementation module 204 may cool down from the unsafe operating temperature to a safe operating temperature), startup of output power from the energy panel arrangement 202 to the inverter 208 may be initiated.

Figure 2I:
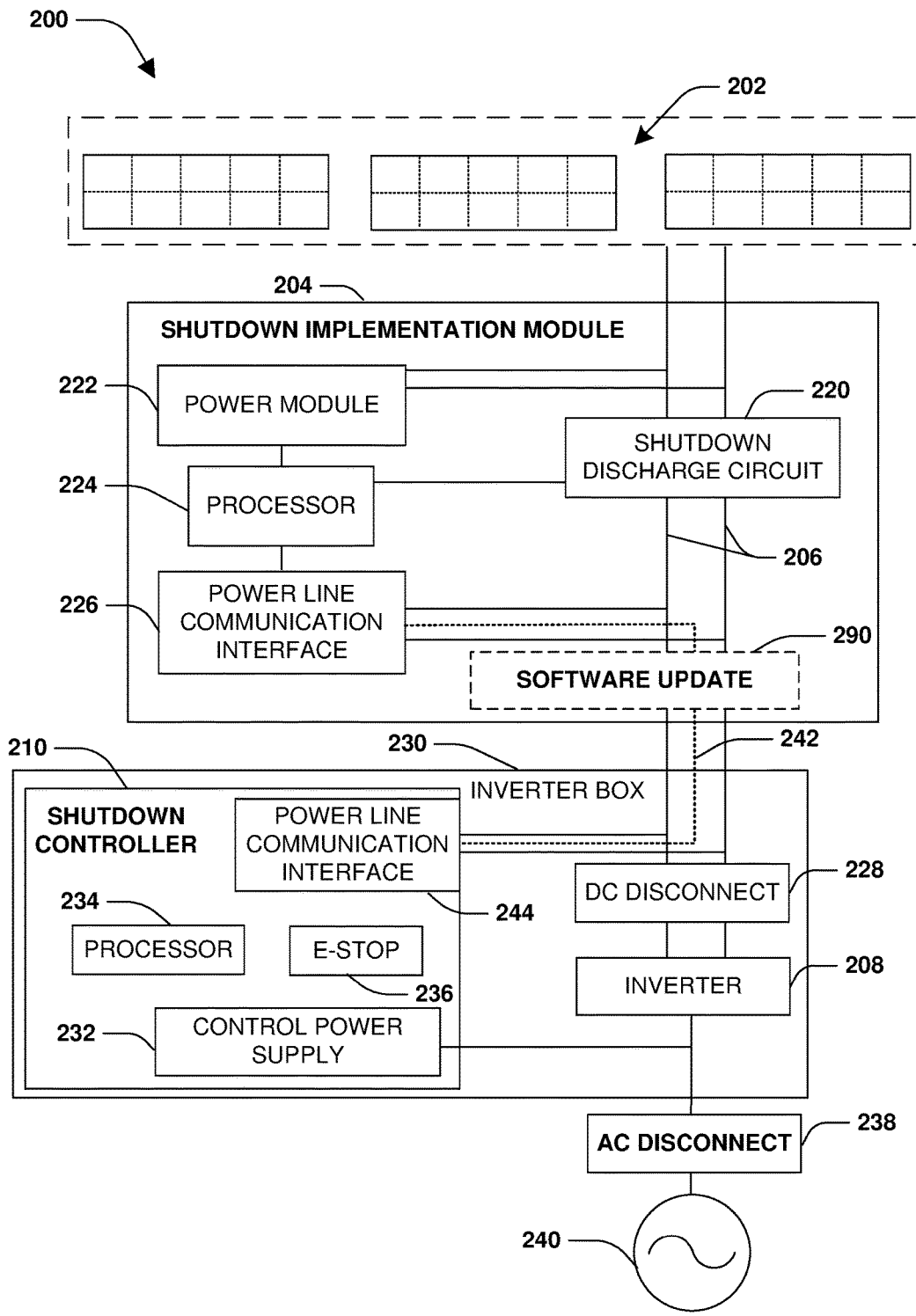
FIG. 2I is a component block diagram illustrating an exemplary system for implementing a software update for a shutdown implementation module.

FIG. 2I illustrates an example of the shutdown implementation module 204 implementing a software update 290. For example, the shutdown implementation module 204 may receive the software update 290 through the power-line communication line 206, such as over the communication connection 242, from the shutdown controller 210 or other source. The software update 290 may comprise an update to software and/or firmware associated with the shutdown implementation module 204. The shutdown implementation module 204, such as the processor 224, may implement the software update 290 for the shutdown implementation module 204.

Figure 3:
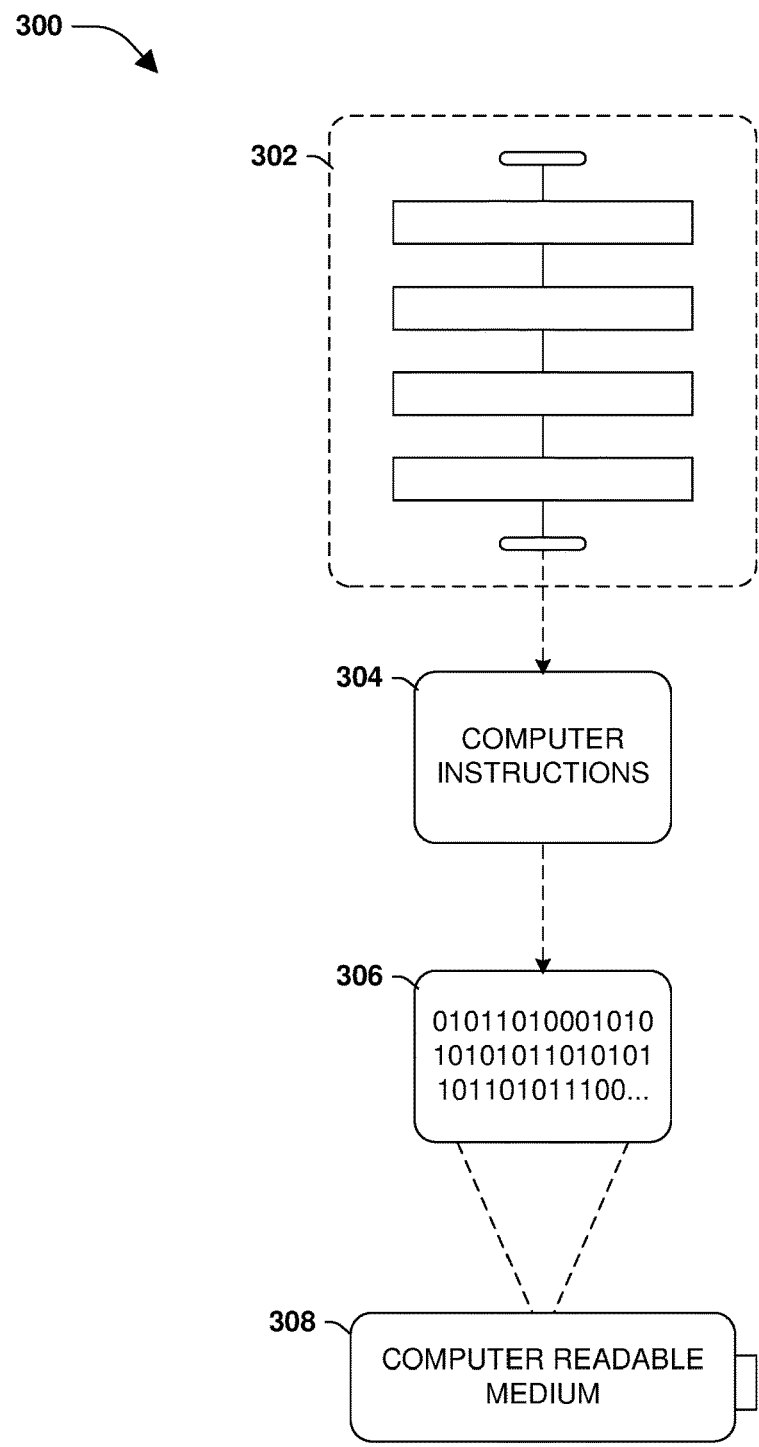
FIG. 3 is an illustration of an exemplary computing device-readable medium wherein processor-executable instructions configured to embody one or more of the provisions set forth herein may be comprised.

Still another embodiment involves a computer-readable medium comprising processor-executable instructions configured to implement one or more of the techniques presented herein. An example embodiment of a computer-readable medium or a computer-readable device is illustrated in FIG. 3, wherein the implementation 300 comprises a computer-readable medium 308, such as a CD-R, DVD-R, flash drive, a platter of a hard disk drive, etc., on which is encoded computer-readable data 306. This computer-readable data 306, such as binary data comprising at least one of a zero or a one, in turn comprises a set of computer instructions 304 configured to operate according to one or more of the principles set forth herein. In some embodiments, the processor-executable computer instructions 304 are configured to perform a method 302, such as at least some of the exemplary method 100 of FIG. 1, for example. In some embodiments, the processor-executable instructions 304 are configured to implement a system, such as at least some of the exemplary system 200 of FIGS. 2A-2I, for example. Many such computer-readable media are devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

As used in this application, the terms "component," "module," "system", "interface", and/or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 4:
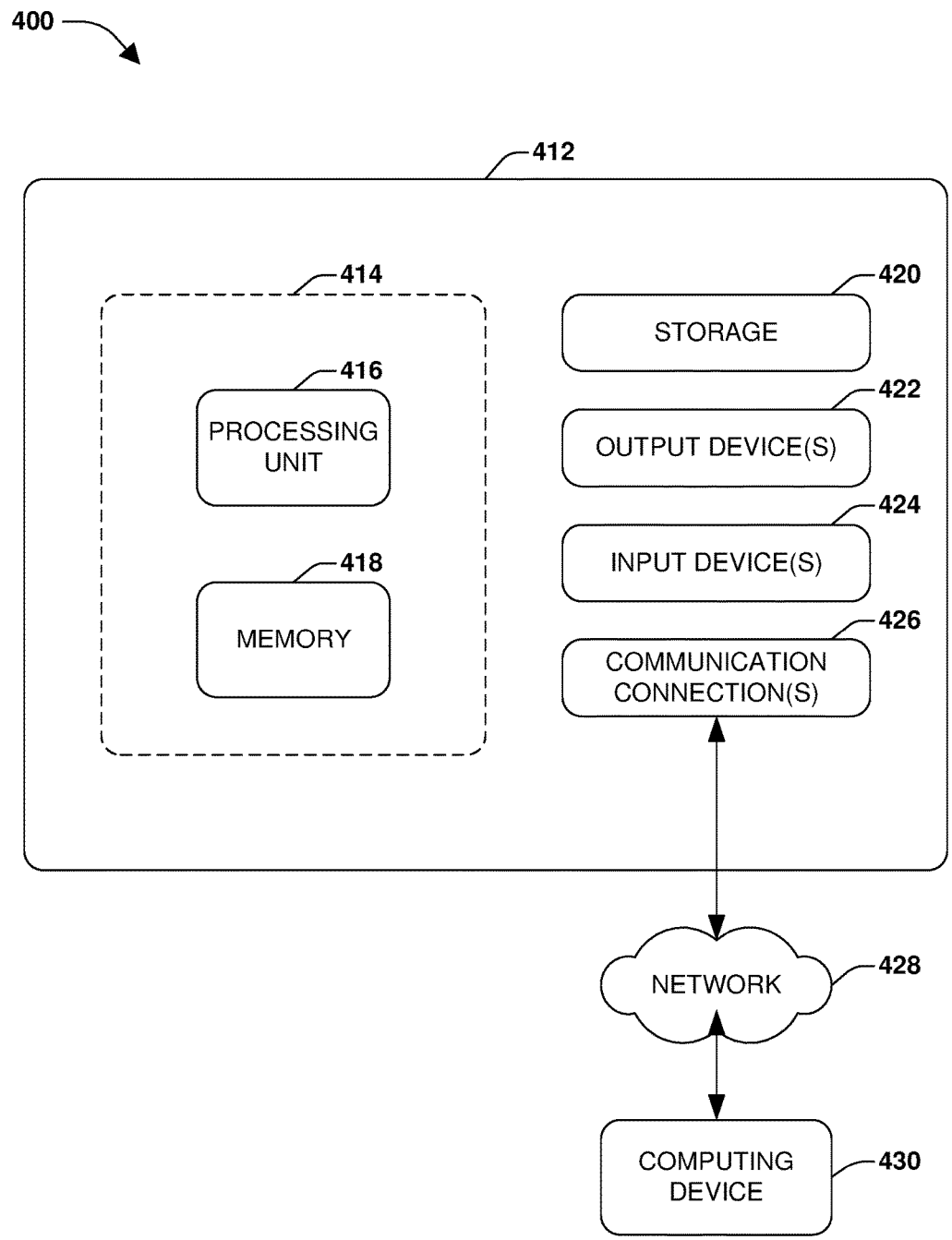
FIG. 4 illustrates an exemplary computing environment wherein one or more of the provisions set forth herein may be implemented.

FIG. 4 and the following discussion provide a brief, general description of a suitable computing environment to implement embodiments of one or more of the provisions set forth herein. The operating environment of FIG. 4 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 4 illustrates an example of a system 400 comprising a computing device 412 configured to implement one or more embodiments provided herein. In one configuration, computing device 412 includes at least one processing unit 416 and memory 418. Depending on the exact configuration and type of computing device, memory 418 may be volatile (such as RAM, for example), non-volatile (such as ROM, flash memory, etc., for example) or some combination of the two. This configuration is illustrated in FIG. 4 by dashed line 414.

In other embodiments, device 412 may include additional features and/or functionality. For example, device 412 may also include additional storage (e.g., removable and/or non-removable) including, but not limited to, magnetic storage, optical storage, and the like. Such additional storage is illustrated in FIG. 4 by storage 420. In one embodiment, computer readable instructions to implement one or more embodiments provided herein may be in storage 420. Storage 420 may also store other computer readable instructions to implement an operating system, an application program, and the like. Computer readable instructions may be loaded in memory 418 for execution by processing unit 416, for example.

The term "computer readable media" as used herein includes computer storage media. Computer storage media includes volatile and nonvolatile, removable and non-removable media implemented in any method or technology for storage of information such as computer readable instructions or other data. Memory 418 and storage 420 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 412. Computer storage media does not, however, include propagated signals. Rather, computer storage media excludes propagated signals. Any such computer storage media may be part of device 412.

Device 412 may also include communication connection(s) 426 that allows device 412 to communicate with other devices. Communication connection(s) 426 may include, but is not limited to, a modem, a Network Interface Card (NIC), an integrated network interface, a radio frequency transmitter/receiver, an infrared port, a USB connection, or other interfaces for connecting computing device 412 to other computing devices. Communication connection(s) 426 may include a wired connection or a wireless connection. Communication connection(s) 426 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 412 may include input device(s) 424 such as keyboard, mouse, pen, voice input device, touch input device, infrared cameras, video input devices, and/or any other input device. Output device(s) 422 such as one or more displays, speakers, printers, and/or any other output device may also be included in device 412. Input device(s) 424 and output device(s) 422 may be connected to device 412 via a wired connection, wireless connection, or any combination thereof. In one embodiment, an input device or an output device from another computing device may be used as input device(s) 424 or output device(s) 422 for computing device 412.

Components of computing device 412 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 412 may be interconnected by a network. For example, memory 418 may be comprised of multiple physical memory units located in different physical locations interconnected by a network.

Those skilled in the art will realize that storage devices utilized to store computer readable instructions may be distributed across a network. For example, a computing device 430 accessible via a network 428 may store computer readable instructions to implement one or more embodiments provided herein. Computing device 412 may access computing device 430 and download a part or all of the computer readable instructions for execution. Alternatively, computing device 412 may download pieces of the computer readable instructions, as needed, or some instructions may be executed at computing device 412 and some at computing device 430.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes", "having", "has", "with", and/or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system for facilitating a shutdown of output power from an energy panel arrangement to an inverter, comprising:
a shutdown implementation module coupled between an energy panel arrangement and an inverter that is configured to convert DC power from the energy panel arrangement to AC power for an AC power grid, the shutdown implementation module configured to:
establish a communication connection, over a power-line communication line between the energy panel arrangement and the inverter, with a shutdown controller associated with the inverter; and
responsive to identifying a loss of the communication connection, initiate a shutdown of output power from the energy panel arrangement to the inverter.

2. The system of claim 1, the power-line communication line comprising a DC power line over which DC power is supplied from the energy panel arrangement to the inverter.

3. The system of claim 1, the shutdown implementation module configured to:
responsive to receiving a shutdown instruction over the power-line communication line from the shutdown controller, initiate the shutdown of output power from the energy panel arrangement to the inverter.

4. The system of claim 1, the loss of the communication connection corresponding to an opening of a DC disconnect of the inverter.

5. The system of claim 1, the shutdown implementation module configured to:
responsive to identifying a power loss of the AC power grid, initiate the shutdown of output power from the energy panel arrangement to the inverter.

6. The system of claim 1, the shutdown implementation module comprising:
a power module configured to provide power to the shutdown implementation module based upon power provided by the energy panel arrangement.

7. The system of claim 1, the shutdown implementation module configured:
identify the loss of the communication connection based upon a loss of a heartbeat signal, received over the power-line communication line, from the shutdown controller.

8. The system of claim 1, the shutdown implementation module configured to:
receive a software update, to apply to the shutdown implementation module, over the power-line communication line; and implement the software update.

9. The system of claim 1, the shutdown implementation module configured to:
receive an arc-fault notification instruction over the power-line communication line from the shutdown controller; and
initiate the shutdown of output power from the energy panel arrangement to the inverter based upon the arc-fault notification instruction.

10. The system of claim 1, the shutdown implementation module configured to:
responsive to detecting an inverter failure of the inverter, implement a short-circuit condition removal procedure.

11. The system of claim 1, the shutdown implementation module configured to:
perform a self-evaluation utilizing at least one of a temperature sensor or an electrical parameter measurement sensor; and
responsive to the self-evaluation resulting in an operational alert for the shutdown implementation module, initiate the shutdown of output power from the energy panel arrangement to the inverter.

12. The system of claim 11, the shutdown implementation module configured to:
responsive to identifying a resolution of an operational issue specified by the operational alert, initiate startup of output power from the energy panel arrangement to the inverter.

13. The system of claim 1, the shutdown implementation module comprising:
a shutdown discharge circuit comprising at least one of a mechanical switch or a semiconductor arrangement, the shutdown discharge circuit configured to discharge output power from the energy panel arrangement.

14. The system of claim 13, the shutdown discharge circuit comprising a resistor used to discharge output power.

15. A system for facilitating a shutdown of output power from an energy panel arrangement to an inverter, comprising:
a shutdown controller associated with an inverter that is configured to convert DC power from an energy panel arrangement to AC power for an AC power grid, the shutdown controller configured to:
establish a communication connection, over a power-line communication line between the energy panel arrangement and the inverter, with a shutdown implementation module coupled between the energy panel arrangement and the inverter; and
responsive to identifying a power shutdown condition, send a shutdown instruction over the power-line communication line to the shutdown implementation module, the shutdown instruction specifying that output power from the energy panel arrangement to the inverter is to be shutdown.

16. The system of claim 15, the shutdown controller configured to:
identify the power shutdown condition based upon an arc-fault.

17. The system of claim 15, the shutdown controller configured to:
identify the power shutdown condition based upon a shutoff status input signal provided to the shutdown controller.

18. The system of claim 15, the shutdown controller configured to:
send a software update over the power-line communication line to the shutdown implementation module, the software update comprising an instruction to update the shutdown implementation module based upon the software update.

19. The system of claim 15, the shutdown controller configured to:
send a heartbeat signal over the power-line communication line to the shutdown implementation module, the heartbeat signal indicating that the shutdown implementation module is to continue the supply of output power from the energy panel arrangement to the inverter.

20. A method for facilitating a shutdown of output power from an energy panel arrangement to an inverter, comprising:

establishing a communication connection, over a power-line communication line between an energy panel arrangement and an inverter, between a shutdown implementation module and a shutdown controller associated with the inverter, the shutdown implementation module coupled between the energy panel arrangement and the inverter; and responsive to at least one of identifying a loss of the communication connection or receiving a shutdown instruction over the power-line communication line from the shutdown controller, initiating a shutdown of output power from the energy panel arrangement to the inverter.

* * * * *